(12) United States Patent
Wijaranakula et al.

(10) Patent No.: US 6,569,749 B1
(45) Date of Patent: May 27, 2003

(54) SILICON AND OXYGEN ION CO-IMPLANATION FOR METALLIC GETTERING IN EPITAXIAL WAFERS

(75) Inventors: Witawat Wijaranakula, Vancouver, WA (US); Jallepally Ravi, Santa Clara, CA (US); Naoto Tate, Gunma (JP)

(73) Assignee: SEH America, Inc., Vancouver, WA (US)

(*) Notice: Subject to any disclaimer, the term of this patent is extended or adjusted under 35 U.S.C. 154(b) by 0 days.

(21) Appl. No.: 09/407,868

(22) Filed: Sep. 27, 1999

Related U.S. Application Data (62) Division of application No. 08/954,960, filed on Oct. 21, 1997, now Pat. No. 6,022,793.

(51) Int. Cl.$^7$ .......................................... H01L 21/322
(52) U.S. Cl. ...................................................... 438/471
(58) Field of Search ................................ 438/473, 766, 438/471, 58, 402; 117/89

(56) References Cited

U.S. PATENT DOCUMENTS

| | | | |
|---|---|---|---|
| 4,401,506 A | | 8/1983 | Otsuka |
| 4,523,963 A | | 6/1985 | Ohta et al. |
| 4,561,171 A | | 12/1985 | Schlosser |
| 4,786,608 A | * | 11/1988 | Griffith ........................ 438/766 |
| 4,885,257 A | | 12/1989 | Matsushita |
| 5,286,658 A | | 2/1994 | Shirakawa et al. |
| 5,306,939 A | | 4/1994 | Mitani et al. |
| 5,355,831 A | * | 10/1994 | Schauer ........................ 117/89 |
| 5,389,551 A | | 2/1995 | Kamakura et al. |
| 5,432,121 A | | 7/1995 | Chan et al. |
| 5,534,294 A | | 7/1996 | Kubota et al. |
| 5,611,855 A | | 3/1997 | Wijaranakula |
| 5,679,476 A | * | 10/1997 | Uemura et al. .............. 428/700 |
| 5,734,195 A | | 3/1998 | Takizawa et al. |
| 6,083,324 A | * | 7/2000 | Henley et al. .............. 148/33.2 |
| 6,140,213 A | * | 10/2000 | Takizawa et al. ........... 438/473 |

FOREIGN PATENT DOCUMENTS

JP    06 338507    12/1994

OTHER PUBLICATIONS

S. Wolf and R.N. Tauber, Silicon Process for the VLSI Era, vol. 1, Process Technology, pp. 61–70, Lattice Press, 1986.*
Materials Science Reports, 6 (1991) pp. 275–366, R. J. Schreutelkamp et al., "Pre–amorphization damage in Ion–implanted Silicon".
Nucl. Instr. And Meth. In Phys. Res. B., 106 (1995), pp. 424–428, J. Wong–Leung et al., "Diffusion and trapping of Au to cavities induced by H–implantation in Si".
Inst. Phys. Conf. Ser. No. 146, Paper presented at Microsc. Semicond. Mater. Conf., pp. 20–23, Mar. 1995, M. Follstaedt et al., "Formation of cavities in Si and their chemisorption of metals".
Second International Autumn Meeting Proceedings: Gettering and Defect Engineering in Semiconductor Technology (GADEST '87) J. Dziesiaty et al., "Improved SI–EPI–Wafers By Buried Damage Layer For Extrinsic Gettering".
IBM Technical Disclosure Bulletin, vol. 17, No. 12, May 1975, T. Nagasaki et al., "Gettering Technique And Structure".

(List continued on next page.)

Primary Examiner—William David Coleman
(74) Attorney, Agent, or Firm—Oliff & Berridge, PLC (57) ABSTRACT

A novel method of generating intrinsic gettering sites in epitaxial wafers employs co-implanting silicon and oxygen into a substrate of the wafer, annealing the substrate at a low temperature, and then depositing the epitaxial layer on a surface of the substrate. The epitaxial deposition acts as an in-situ anneal to form dislocation loops that act as gettering sites. Oxygen precipitate clusters form during the method, which clusters act to anchor the dislocation loops and prevent them from gliding to the wafer surface over time.

14 Claims, 5 Drawing Sheets

OTHER PUBLICATIONS

J. Appl. Phys., 76(4), Aug. 15, 1994, G. Galvagno et al., "Al–O Interactions In Ion–Implanted Crystalline Silicon".

Appl. Phys. Lett., 50(15), Apr. 13, 1987, David H. Weiner et al., "Oxygen Implantation For Internal Gettering And Reducing Carrier Lifetime".

Proceedings 1995 IEEE International SOI Conference, Oct. 1995, J. Jablonski et al., "Gettering Layer Formation In Low–Dose SIMOX Wafers".

Proceedings of the Fifth International Symposium on Silicon–on–Insulator Technology and Devices; pp. 416–422, H. D. Chiou et al., "Gettering Of Bonded SOI Layers" (1992).

Mat. Res. Soc. Symp. Proc., vol. 396, 1996, Jianming Li et al., "Properties Of Silicon–On–Defect–Layer Material".

"Electrical and Crystallographic Evaluation of SOS Implanted with Silicon and/or Oxygen", Y. Yamamoto et al., vol. B7/8, No. 1, Part 1, Mar. 1985, pp. 273–277.

"Hydrogen–Induced Defects in Silicon by $CF_4/x\%H_2$ (0<x<100) RIE and $H_2$ Plasma", Shwu–Jen Jeng et al., Mat. Res. Soc. Symp. Proc., vol. 104, 1988, pp. 247–252.

"Implantation Gettering in Silicon", S. S. Gong et al., Solid–State Electronics, vol. 30, No. 2, 1987, pp. 209–211.

"Defects in Oxygen Implanted Silicon", Supapan Seraphin, Solar Energy Materials and Solar Cells, 1994, pp. 343–349.

"A Systematic Analysis of Defects in Ion–Implanted Silicon", K. S. Jones et al., Appl. Phys. A, 1988, pp. 1–34.

* cited by examiner

SILICON AND OXYGEN ION CO-IMPLANATION FOR METALLIC GETTERING IN EPITAXIAL WAFERS

This application is a divisional of Ser. No. 08/954,960 filed Oct. 21, 1997, now U.S. Pat. No. 6,022,783.

BACKGROUND OF THE INVENTION

1. Field of the Invention

This invention relates to a method of creating gettering sites for metallic impurities within the subsurface of a wafer substrate in-situ through epitaxial deposition. Such wafers are suitable for device fabrication in low temperature integrated circuit (IC) processes of future generation high density devices.

2. Discussion of Related Art

In the manufacture of electronic components from semiconductive wafers, it is known that impurities introduced into the wafer during formation processes, particularly metallic impurities, can have various adverse effects. For example, such impurities can cause increased leakage currents at barrier layers and capacitors in integrated circuits.

To address this problem, various methods, referred to as gettering methods, are known which attempt to remove impurities and other defects from the wafer and/or capture the impurities and defects. Extrinsic gettering techniques involve physically damaging a surface of the wafer, typically a rear surface, to create faults that become gettering sites, i.e., sites where the impurities are captured. An example of a known extrinsic gettering method involves bombarding the rear surface of a wafer with fine particles such as silicon. Intrinsic gettering, on the other hand, typically involves heat treating, i.e., annealing, in a cycle of high temperature, low temperature and medium temperature, in order to form and grow oxygen precipitates from the small amounts of bulk intrinsic oxygen present in the silicon. Such precipitates act as gettering sites. See, for example, U.S. Pat. Nos. 5,534,294 and 5,286,658.

However, anneal temperatures typically higher than 1,000° C. are required to grow precipitates from the intrinsic oxygen. As wafer technology continues to advance, and device structures on the wafer become denser, it is becoming necessary to avoid high temperature processing because high temperatures result in problems such as warping in these future generation wafers. The high temperatures needed in known intrinsic gettering methods are thus problematic.

Ion implantation is also known as a method of creating gettering sites in silicon wafers. For example, M. Follstaedt et al., "Formation of Cavities in Si and Their Chemisorption of Metals", Inst. Phys. Conf. Ser. No. 146, pages 481–484 (1985) describes a method in which helium is implanted into a silicon semiconductive wafer at a typical dose of $1 \times 10^{17}$ He/cm$^2$ at 30 keV to form cavities in the wafer, followed by vacuum annealing at 700 to 900° C. to cause the He to permeate from the silicon and enlarge the cavities. Such cavities act as gettering sites.

J. Wong-Leung et al., "Diffusion and Trapping of Au to Cavities Induced by H-Implantation in Si", Nucl. Instr. And Meth. In Phys. Res. B 106, pages 425–428 (1995) similarly describes the formation of cavities in a silicon wafer through the use of H implantation.

Rather than form cavities, other ion implantation techniques in which dislocation loops are found in the wafer and act as sinks for impurities are known. For example, J. Dziesiaty et al., "Improved Si-Epi-Wafers By Buried Damage Layer For Extrinsic Gettering", 2nd International Autumn Meeting Proceedings: Gettering and Defect Engineering In Semiconductor Technology, pages 292–296 (1987), describes the use of ion implantation with non-doping elements such as Ar or Ne. These elements are implanted into the substrate, which is then annealed to annihilate the defects in the surface region while also growing the dislocation loops within the silicon substrate. Etching may be performed in order to remove the damage layer altogether in order to prevent redistribution of the contaminants in subsequent high temperature processing steps. T. Nagasaki et al., "Gettering Technique and Structure", IBM Technical Disclosure Bulletin, vol. 17, no. 12, pages 3587–3588 (1975) also describes the use of Ar ion implantation.

Ion implantation with P and Si is also known. See, for example, G. Galvagno et al., "Al—O Interactions in Ion-Implanted Crystalline Silicon", J. Appl. Phys., 76(4), pages 2070–2077 (1994). This reference indicates that a high temperature annealing step, on the order of 1,000 to 1,250° C., is required for nucleation and growth of gettering sites.

D. Weiner, "Oxygen Implantation For Internal Gettering and Reducing Carrier Lifetime", Appl. Phys. Lett. 50(15), pages 986–988 (1987) describes the use of oxygen implantation in gettering. The method utilizes doses of oxygen in the range of $10^{15}$ to $10^{16}$ cm$^{-2}$ and an annealing temperature of 950° C. to produce buried defect gettering sites.

However, such ion implantation methods of gettering also suffer from several deficiencies. The significant defect formation can be clearly seen when the implantation doses exceed $10^{16}$ cm$^{-2}$. The defects consist of large dislocation loops and nanometer-size oxide precipitates which are insufficient to prevent the large dislocation loops from sliding to the surface of the wafer over time. This degrades and destroys the performance of integrated circuits manufactured from such wafers. Furthermore, oxygen implantation utilizing high doses is expensive and therefore commercially infeasible since the cost for an oxygen implantation increases proportionally with the oxygen implantation doses. The cost for an implantation that utilizes an oxygen dose of, for example, $10^{16}$ cm$^{-2}$ would be 100 times higher than that which utilizes dose of $10^{14}$ cm$^{-2}$. Therefore, the maximum defect generation utilizing an implantation with the least amount of oxygen doses would be desirable.

Ion implantation is also known for other uses. For example, ion implantation has been used to introduce dopants into semiconductive wafers. See Schreutelkamp et al., "Pre-amorphization Damage in Ion-Implanted Silicon", Materials Science Reports, pages 277–367 (1991). Oxygen implantation is used in SIMOX (Separation by Implanted Oxygen) methods, in which a buried layer of silicon dioxide is formed beneath the surface of a silicon wafer. See, for example, J. Jablonski et al., "Gettering Layer Formation in Low-Dose SIMOX Wafers", Proceedings 1995 IEEE International SOI Conference, pages 34–35 (1995). As described in this reference, formation of the buried layer requires high temperature annealing.

What is desired is an intrinsic gettering technique that is effective in capturing impurities and point defects in a silicon wafer substrate, that does not require high temperature annealing steps, and that yields wafers in which the gettering sites remain stable over time.

SUMMARY OF THE INVENTION

It is an object of the present invention to develop an effective method of creating gettering sites in an epitaxial wafer. It is a further object of the present invention to develop a method of generating intrinsic gettering sites without any high temperature annealing steps. It is a still further object of the present invention to develop a method of gettering that achieves an epitaxial wafer in which metallic impurities have been gettered within the subsurface of the wafer substrate in dislocation loops, which dislocation loops remain stable and do not glide to the wafer surface over time.

These and other objects are achieved by a method of creating gettering sites in an epitaxial wafer, the method comprising implanting silicon ions into a substrate of the wafer;

implanting oxygen ions into the substrate of the wafer;

thermally annealing the substrate of the wafer for a period of time sufficient to nucleate defects in the substrate; and depositing an epitaxial layer upon a surface of the substrate, thereby forming gettering sites from the nucleated defects in the wafer.

The objects of the invention are also achieved by a semiconductive wafer comprising a substrate and an epitaxial layer on the substrate, wherein the substrate contains dislocation loops as gettering sites anchored by oxygen precipitate clusters so as to prevent the dislocation loops from sliding to the surface of the wafer over time.

DETAILED DESCRIPTION OF PREFERRED EMBODIMENTS

The process of the invention introduces dislocation loops, which act as gettering sites of point defects and impurities, particularly metallic impurities, in a substrate of a semiconductive wafer. The dislocation loops are preferably located in a subsurface of the substrate. The starting substrate is preferably silicon and may be obtained by any conventional method or from any supplier. For example, the silicon substrate may be sliced from an ingot that is, for example, Czochralski (Cz) grown, floating zone (FZ) grown, etc., as known in the art.

The substrate may be of any suitable type and have properties appropriate for the production of integrated circuits. The substrate typically has a thickness of from, for example, about 0.1 to about 3 mm and a specific resistivity of from, for example, about 1 mΩcm to about 50 Ωcm, preferably 5 mΩcm to 15 Ωcm. The crystalline structure of the silicon substrate may be of any suitable type, including, for example, 100 or 111. The substrate may be of the p or n type, although substrates of the p⁻ type are preferred.

The substrate may have the conductivity of pure silicon, or it may have its conductivity adjusted by any well known dopant. Such dopants include, for example, boron, phosphorus, antimony, arsenic and the like. If a dopant is present, it is preferably present in an amount of from, for example, about $1\times10^{14}$ to about $2\times10^{19}$ atoms/cm$^3$. The optional dopant may be introduced by any suitable known method. In a preferred embodiment, boron is included as a dopant. In another preferred embodiment, the concentration of dopant in the substrate is higher than the concentration of dopant in the epitaxial layer.

Of course, it should be understood that the invention can be practiced using semiconductive silicon substrates having wide ranges of thicknesses, dopants and dopant concentrations, considering that a preferred end use of the wafer is as an integrated circuit.

Defects are introduced into the wafer substrate through co-implantation with silicon ions and oxygen ions. The timing of the co-implantation is not believed to materially affect the results, and the oxygen ions may be implanted into the substrate at any time with respect to the implantation of the silicon ions. For example, the oxygen ions may be implanted into the substrate prior to or subsequent to the implantation of the silicon ions into the substrate.

A surprising result from the present invention is the density of the defects achieved through co-implantation with silicon and oxygen. The density of the defects achieved by silicon and oxygen together is surprisingly beyond the degree of cumulative damage that might otherwise be expected from the implantation of more ions, i.e., oxygen ions in addition to silicon ions, alone. In other words, an advantage of co-implantation with both silicon and oxygen is that the total amount of dose of ions that is necessary to create the intrinsic gettering sites is relatively small. Smaller doses result in less damage to the surface of the substrate during implantation, thus resulting in lower manufacturing costs.

The implantation of the ions may be carried out using any suitable equipment such as, for example, a low energy ion implanter operating in the keV range or a high energy implanter operating in the MeV range. From the stand point of cost and availability, the low energy implanter is preferred.

The energy of implantation controls the depth to which the ions will be implanted into the substrate. Higher atomic weight ions require higher energies in order to be deposited to the same depth as lower atomic weight ions. Preferably, the energy of implantation of the silicon ions and the oxygen ions respectively is selected so that the silicon ions and oxygen ions are implanted to the same depth in the substrate. The silicon ions and oxygen ions are implanted into the subsurface of the substrate to a depth of from, for example, about 50 to about 500 Angstroms, preferably about 50 to about 300 Angstroms from the substrate surface. The silicon ions are preferably implanted at energies ranging from, for example, about 50 to about 500 keV, preferably 100 to 300 keV. The oxygen ions are preferably implanted at energies ranging from about 50 to about 400 keV, preferably 100 to 200 keV.

The doses of silicon and oxygen may be selected as desired. Higher doses result in denser concentrations of the ions within the substrate. Higher doses cost more to implant and typically require more passes with the implanter to complete implantation compared to lower doses of materials. As mentioned above, the present invention permits the implantation of lower doses while still achieving a suitable amount of damage for gettering. The doses of both the silicon and oxygen may range from, for example, about $1 \times 10^{13}/cm^2$ to about $1 \times 10^{16}/cm^2$. Preferred doses in the present invention range from, for example, $1 \times 10^{14}/cm^2$ to $1 \times 10^{15}/cm^2$.

The co-implantation of silicon and oxygen ions into the substrate introduces defects into the substrate from the surface of the substrate bombarded with the ions down to the target depth of implantation. Preferably, the surface that is bombarded with the ions is the surface that ultimately has the epitaxial layer deposited thereon.

Following implantation with both the silicon ions and oxygen ions, the substrate is subjected to a low temperature thermal anneal. The thermal anneal preferably occurs at a temperature at or below 800° C., more preferably from about 600° C. to about 700° C. The thermal anneal should continue for a period of time sufficient to nucleate the defects in the implanted layer. At a temperature of from about 600° C. to about 700° C., a thermal anneal of from 2 to 8 hours, preferably 3 to 5 hours, for example, may be suitable.

The thermal anneal also assists in healing the lattice damage at the surface of the substrate caused by the ion bombardment. Thermal anneal should not take place for so long a period of time as to dissolve the defects formed in the subsurface, i.e., the defects in the implanted layer, of the substrate.

While a thermal anneal preferably takes place at a constant temperature, it is also possible to conduct the thermal anneal through several heating/cooling cycles, i.e., at different temperatures. Again, the temperature of any heating should preferably be less than, for example, 800° C.

The thermal anneal preferably occurs in an inert atmosphere, for example a nitrogen or argon atmosphere. Although the anneal may occur under a vacuum if desired, it is preferred that the anneal take place at ambient.

Following nucleation of the defects in the subsurface of the substrate and healing of the lattice at the surface of the substrate, the substrate is then subjected to deposition of the epitaxial layer. Deposition of the epitaxial layer acts as an in-situ anneal in which the defects are grown into dislocation loops within the subsurface of the substrate at the depth of the ion implantation. The dislocation loops act as gettering sites which capture impurities and point defects present in the lattice structure of the wafer.

Also during the deposition of the epitaxial layer, oxygen precipitate clusters form in and around the dislocation loops as a result of the excess oxygen ions introduced by the ion implantation. These oxygen precipitate clusters, for example silicon dioxide and oxides of dopant materials, for example boron oxide, act uniquely to anchor the dislocation loops within the subsurface of the substrate. Thus, the oxygen precipitate clusters act to prevent the dislocation loops from gliding to the surface of the wafer over time, which would have the effect of destroying and/or degrading the performance of an integrated circuit formed using the wafer.

Deposition of the epitaxial layer may occur through the use of any well known deposition process, for example including chemical vapor deposition (CVD), thermal decomposition, pyrolysis and the like. So that the epitaxial layer deposition acts as an in-situ anneal, the deposition should preferably occur at a temperature of from, for example, about 900° C. to about 1,200° C., more preferably 1,000° to 1,050° C.

No particular restrictions are placed upon the composition and properties of the epitaxial layer, the user selecting the desired compositions and properties as well within his skill. In a preferred embodiment of the present invention, the epitaxial layer is silicon of the p⁻ type, although silicon of either the p type or n type may suitably be used.

The thickness of the epitaxial layer may be, for example, from less than 1 μm up to about 100 μm, preferably from less than 1 μm up to 15 μm. The epitaxial layer, like the substrate, may be doped with any suitable dopant including, for example, boron, phosphorous, antimony, arsenic and the like. The dopant concentrations may be similar to those for the substrate discussed above, although the epitaxial layer may contain a lower concentration of dopant than the substrate. The epitaxial layer may also have a specific resistivity similar to that of the substrate, for example ranging from about 5 mΩcm to about 50 Ωcm, preferably 0.1 to 15 Ωcm.

The epitaxial layer may comprise more than one layer, i.e., it may be a multilayer structure. The layers of the multilayer epitaxial structure may have different properties, for example containing different dopants or having different resistivities, different thicknesses, etc. Such a multilayer epitaxial structure is described in U.S. Pat. No. 5,432,121, the entire disclosure of which is hereby incorporated by reference.

The invention will now be further described by way of the following examples.

EXAMPLE 1

This Example illustrates the effect of the thermal annealing step prior to deposition of the epitaxial layer. A p<100> substrate with a specific resistivity of 10 to 15 Ωcm is subjected to silicon implantation at 200 keV with a silicon dose of $2 \times 10^{14}/cm^2$ and subsequently subjected to oxygen implantation at 135 keV with an oxygen dose of $4 \times 10^{14}/cm^2$. The sample is then annealed for 4 hours at 650° C. under nitrogen ambient. A 1.6 μm silicon epitaxial layer with a specific resistivity of 10 to 15 Ωcm is then deposited on the sample at a temperature of 1,050° C.

Figure 1A:
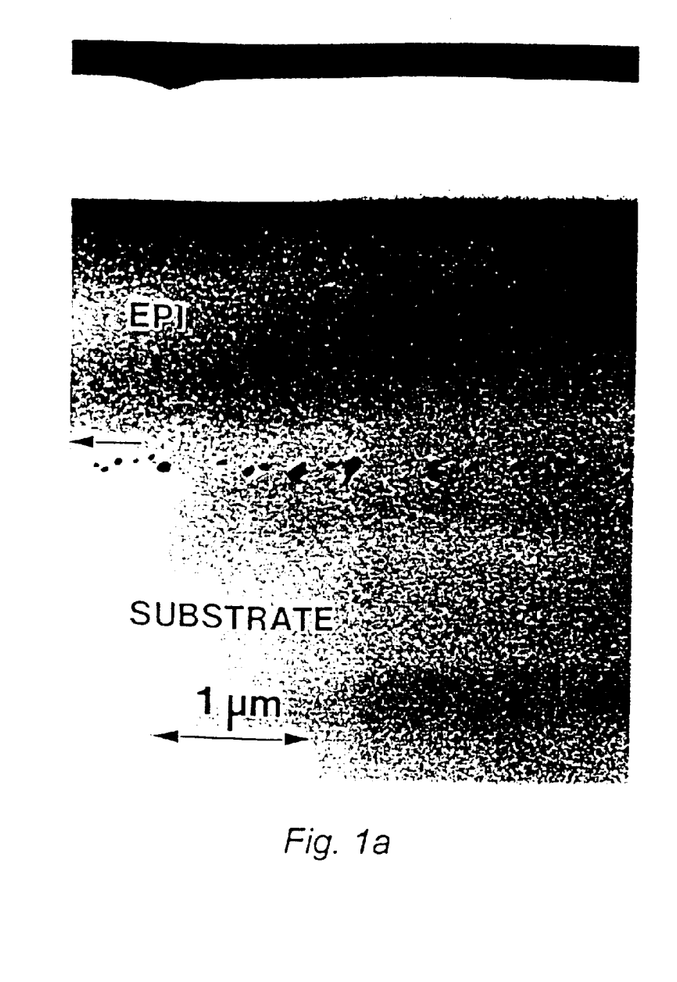
FIGS. 1a and 1b are cross-sectional transmission electron microscope (TEM) images of a silicon wafer prepared according to the invention and showing the stability of the dislocation loops in the subsurface of the wafer substrate.

FIG. 1a is a cross-sectional TEM of the wafer produced in this Example, showing the gettering sites in the substrate.

To evaluate the stability of the gettering sites, a device simulation is run. The wafer is subjected to a further annealing at 950° C. for 4 hours.

Figure 1B:
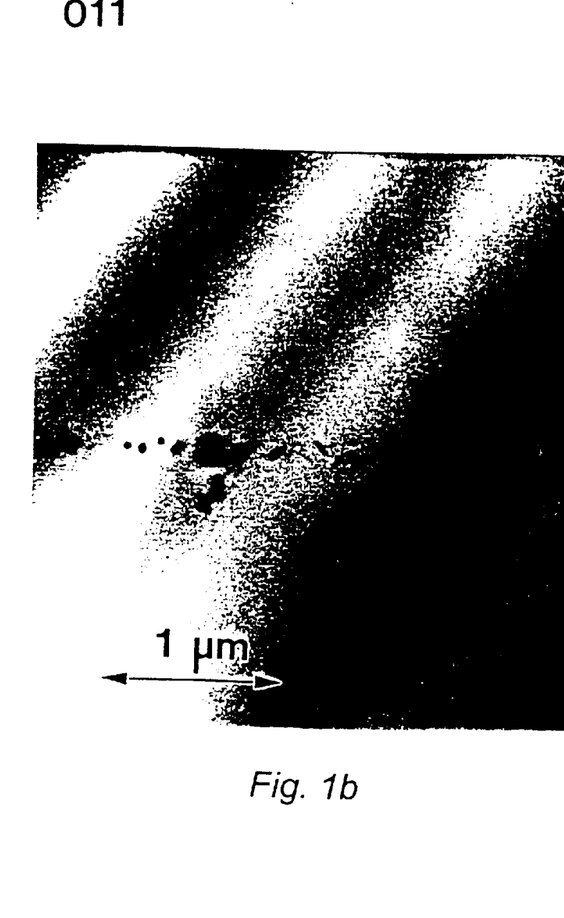

FIG. 1b is a cross-sectional TEM of the wafer following the further annealing. As seen by comparing the TEMs for FIGS. 1a and 1b, the gettering sites in the substrate are stable, which is a result of the lower temperature annealing step prior to deposition of the epitaxial layer.

Figure 2:
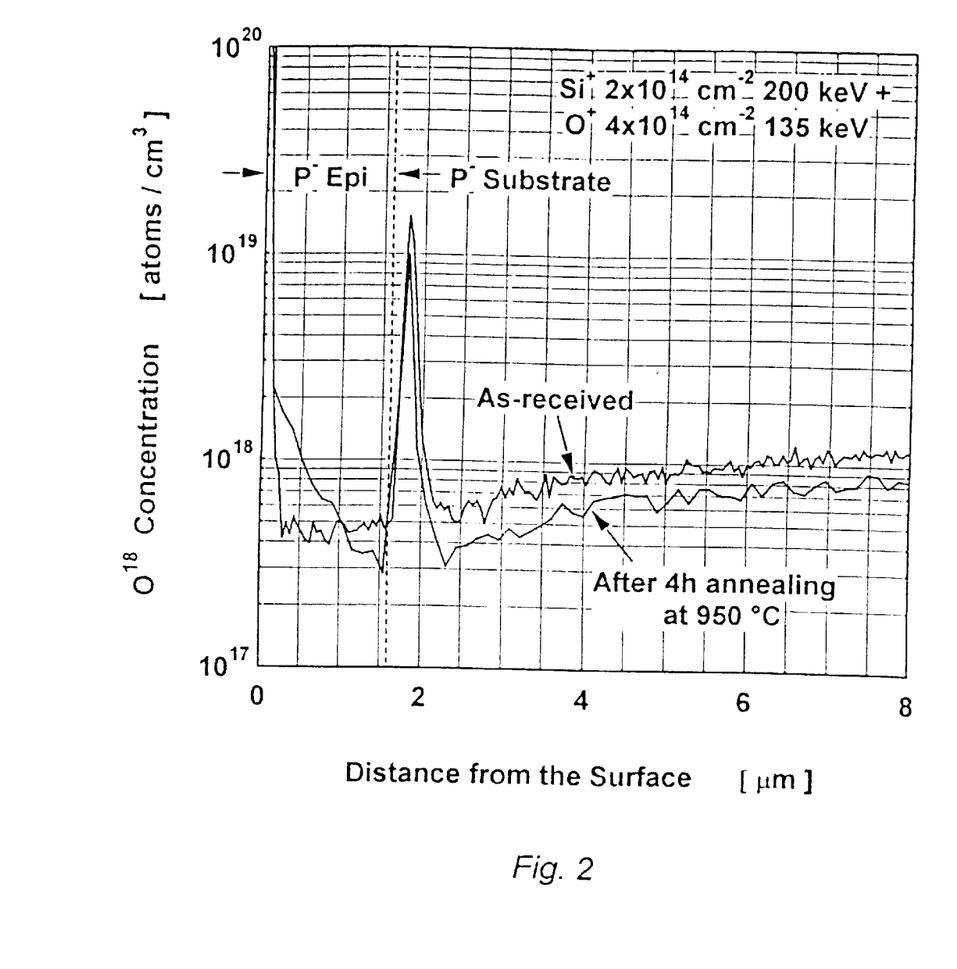
FIG. 2 is a secondary ion mass spectrometry (SIMS) profile of a silicon wafer prepared according to the invention, also illustrating the stability of the dislocation loops in the subsurface of the wafer.

A secondary ion mass spectrometry (SIMS) profile is also prepared of this wafer both after formation of the wafer and also after the further thermal anneal (FIG. 2). As shown in FIG. 2, the SIMS profiles before and after the additional post-formation anneal are nearly identical, the differences being within measurement error tolerances. This Example illustrates the stability of the dislocation loops in the substrate, which loops are pinned by the oxygen precipitate clusters.

Comparative Example 1

The wafer of this Comparative Example is prepared identically to the wafer of Example 1, with the exception that the annealing step prior to deposition of the epitaxial layer is omitted.

Figure 3:
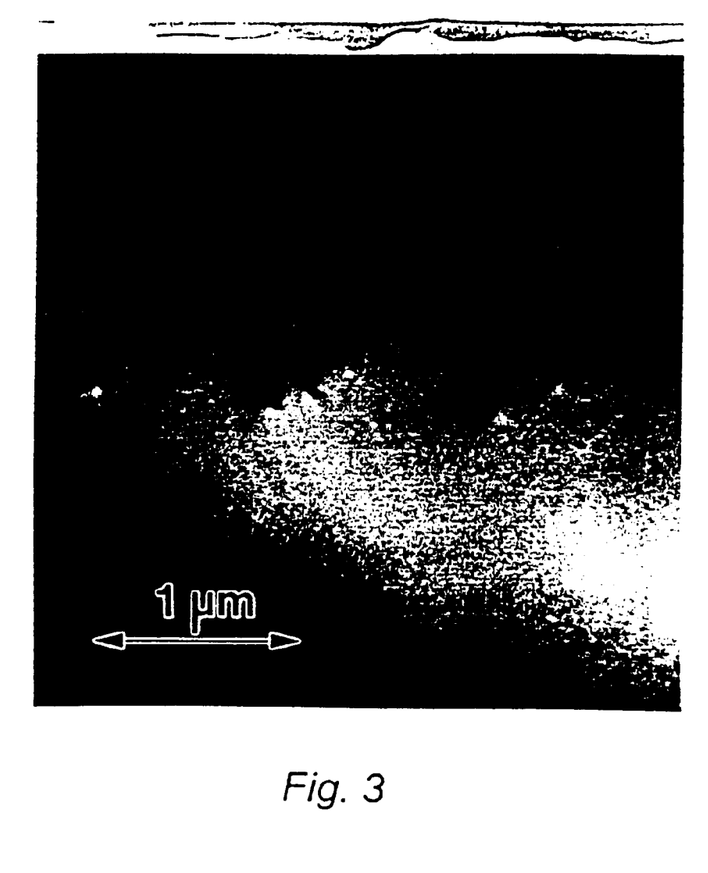
FIG. 3 is a TEM image of a comparative sample illustrating the formation of insufficiently nucleated and grown defects in the substrate of the wafer.

FIG. 3 is a cross-sectional TEM of the wafer of this Comparative Example. As shown, the gettering sites in the substrate of this wafer are not sufficiently nucleated and grown, and such sites would lack stability.

EXAMPLE 2

This Example illustrates the benefits of coimplantation with silicon and oxygen.

A p<100> substrate with a specific resistivity of 10 to 15 Ωcm is subjected to silicon implantation at 200 keV with a silicon dose of $2 \times 10^{14}/cm^2$ and then subsequently subjected to oxygen implantation at 135 keV with an oxygen dose of $4 \times 10^{14}/cm^2$. The sample is annealed for 4 hours at 650° C. under nitrogen ambient. A 1.6 μm silicon epitaxial layer with a specific resistivity of 10 to 15 Ωcm is then deposited on the sample at a temperature of 1,050° C.

Figure 4A:
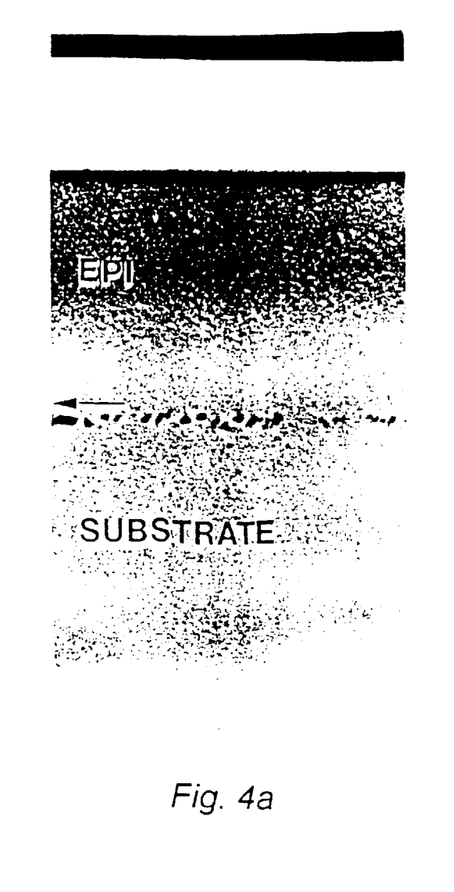
FIG. 4a is a TEM of a wafer prepared according to the invention and co-implanted with both silicon and oxygen.

FIG. 4a is a cross-sectional TEM of the wafer prepared according to this Example.

Comparative Example 2

A wafer is prepared the same as in Example 2, with the exception that oxygen ions are not implanted along with the silicon ions.

Figure 4B:
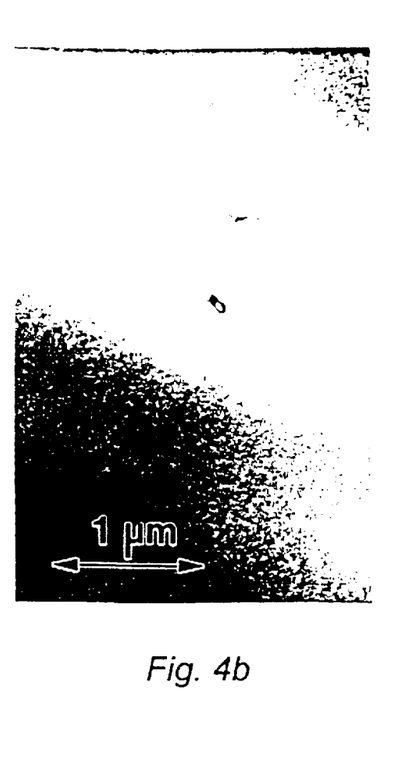
FIGS. 4b and 4c are cross-sectional TEMs of comparative wafers implanted with only silicon and with only oxygen, respectively.

FIG. 4b is a cross-sectional TEM of the wafer prepared according to this Comparative Example.

Comparative Example 3

A wafer is prepared the same as in Example 2, with the exception that silicon ions are not implanted along with the oxygen ions.

Figure 4C:
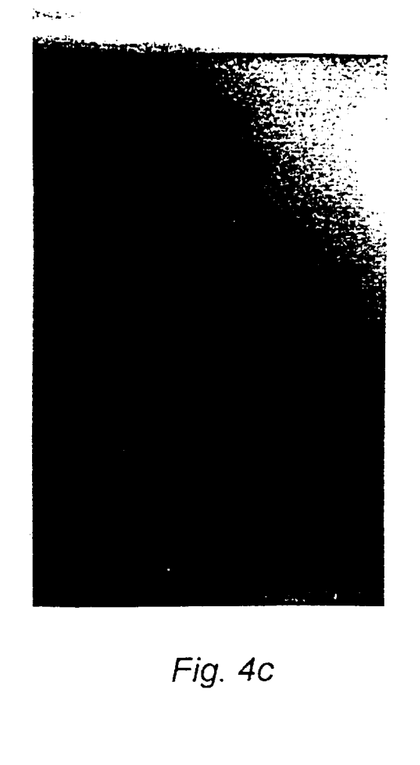

FIG. 4c is a cross-sectional TEM of the wafer prepared according to this Comparative Example.

As shown in comparing FIGS. 4a to 4c, co-implantation according to the invention generates a large amount of dislocation loops pinned by oxygen precipitates at the desired depth (approximately 1.6 μm) which are stable and act as potential gettering sites during device processing (see FIG. 4a). FIG. 4b is the cross-sectional TEM image for the Comparative Example 2 group of wafers subjected to only silicon ion implantation, while FIG. 4c is the TEM image for the Comparative Example 3 group of samples subjected to only oxygen ion implantation. As seen in both Figures, these treatments generate only a very low density of dislocation loops which would not perform satisfactorily as gettering sites in semi conductive wafers. It is also evident from FIG. 4a that even though the total amount of ions co-implanted is relatively low, the amount of defects created is sufficient for gettering.

EXAMPLE 3

This Example illustrates the gettering ability of the wafers of the present invention. The sample of this Example is prepared the same as the sample in Example 1. To this sample there is intentionally introduced Cu as a metallic impurity as follows. A cupric nitrate solution is painted onto the wafer surface and driven into the wafer by heating the wafer to 950° C. The wafer is then cooled down and subjected to secondary ion mass spectrometry (SIMS) to determine the oxygen and copper profiles.

Figure 5:
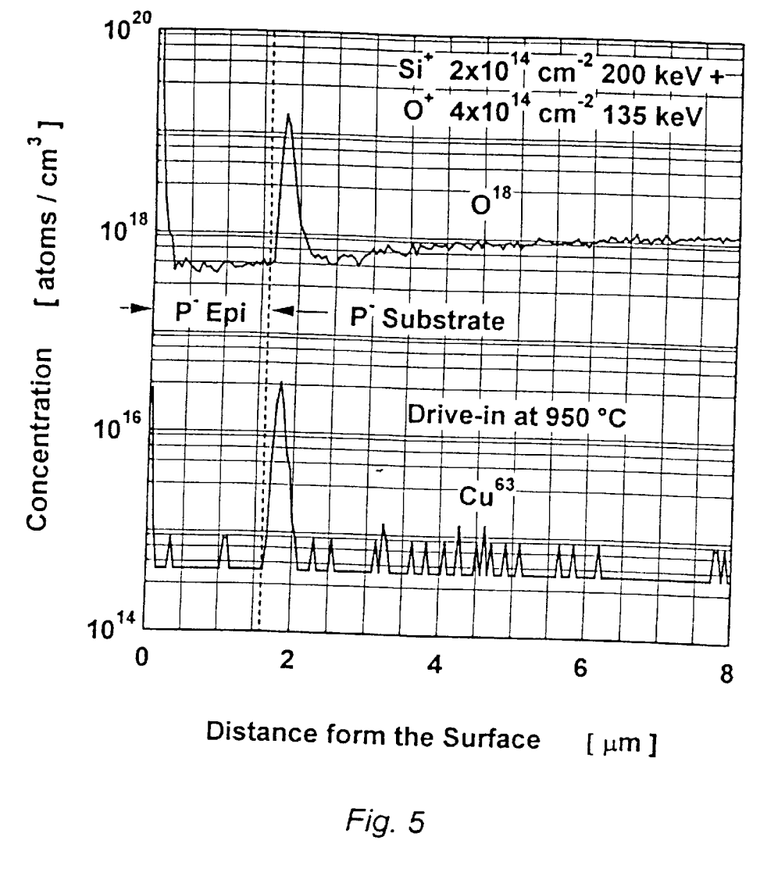
FIG. 5 is a SIMS profile of a sample of the invention illustrating the effectiveness of the ability of the dislocation loops in gettering intentionally introduced copper.

FIG. 5 illustrates the SIMS profile of this Example. In the Figure, the vertical axis represents ion concentration in atoms/cm$^3$ while the horizontal axis represents the distance from the wafer surface in μm. The vertical dashed line indicates the substrate/epitaxial layer interface. The peak oxygen concentration shows the location of the dislocation loops in the substrate. The peak copper concentration also occurs at this depth, indicating that the dislocation loops effectively getter the metallic impurity.

The incorporation of subsurface gettering sites into an epitaxial wafer in accordance with the present invention achieves significant advantages. The co-implantation of silicon and oxygen ions allows for the elimination of high temperature annealing steps. Thus, the invention enables the reduction of device processing steps that otherwise would have to be used to generate nucleation and precipitation of defects within the bulk of the wafer. Another advantage is that the precipitate formation takes place in-situ during the deposition of the epitaxial layer so that no additional heat treatments such as required in conventional precipitation formation is necessary.

What is claimed is:

1. An epitaxial wafer comprising a substrate and an epitaxial layer on a surface of the substrate, wherein a subsurface below the surface of the substrate contains gettering sites formed by implanting both silicon ions and oxygen ions into the substrate, thermally annealing the substrate, and depositing the epitaxial layer on the surface of the substrate, and wherein the gettering sites are anchored in the substrate by oxygen precipitate clusters.

2. An epitaxial wafer according to claim 1, wherein the substrate and the epitaxial layer comprise silicon.

3. An epitaxial wafer according to claim 1, wherein the substrate, the epitaxial layer, or both are doped.

4. An epitaxial wafer according to claim 1, wherein the substrate and the epitaxial layer are p.

5. An epitaxial wafer according to claim 1, wherein the epitaxial layer comprises one or more layers.

6. An epitaxial wafer according to claim 1, wherein the epitaxial layer has a thickness of from less than 1 μm up to about 100 μm.

7. An epitaxial wafer according to claim 1, wherein the epitaxial layer has a specific resistivity of from about 5 mΩcm to about 50 Ωcm.

8. An epitaxial wafer according to claim 1, wherein the substrate has a specific resistivity of from 1 mΩcm to about 50 Ωcm.

9. An epitaxial wafer according to claim 1, wherein the subsurface is located about 50 to about 300 Angstroms below the substrate surface.

10. An epitaxial wafer according to claim 1, wherein the oxygen precipitate clusters comprise silicon dioxide.

11. An epitaxial wafer according to claim 3, wherein the substrate has a higher dopant concentration than the epitaxial layer.

12. An epitaxial wafer according to claim 1, wherein a dose of oxygen in the implanting of the oxygen ions is in a range of from about $1 \times 10^{13}/cm^2$ to about $1 \times 10^{16}/cm^2$.

13. An epitaxial wafer according to claim 1, wherein a dose of oxygen in the implanting of the oxygen ions is in a range of from about $1 \times 10^{14}/cm^2$ to about $1 \times 10^{15}/cm^2$.

14. An epitaxial wafer according to claim 1, wherein the oxygen precipitate clusters anchoring the dislocation loops are formed in and around the dislocation loops.

* * * * *